United States Patent
Warner (10) Patent No.: US 6,498,510 B2
(45) Date of Patent: Dec. 24, 2002

(54) ADAPTIVE THRESHOLD LOGIC CIRCUIT

(75) Inventor: David J. Warner, Addlestone (GB)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/805,100

(22) Filed: Mar. 14, 2001

(65) Prior Publication Data

US 2002/0130682 A1 Sep. 19, 2002

(30) Foreign Application Priority Data

Mar. 8, 2001 (GB) .............................. 0105690

(51) Int. Cl.⁷ .......................................... H03K 19/0175
(52) U.S. Cl. .............................. 326/81; 326/36; 326/62; 326/63; 326/68
(58) Field of Search .............................. 326/35, 36, 62, 326/63, 68, 80, 81

(56) References Cited

U.S. PATENT DOCUMENTS

| | | | |
|---|---|---|---|
| 4,506,168 A | * 3/1985 | Uya | 327/206 |
| 4,539,489 A | * 9/1985 | Vaughn | 327/206 |
| 4,603,264 A | * 7/1986 | Nakano | 327/206 |
| 5,240,196 A | 8/1993 | Baarfuesser | |
| 5,444,392 A | 8/1995 | Sommer et al. | |
| 5,654,664 A | 8/1997 | Park et al. | |
| 5,751,166 A | 5/1998 | Shieh et al. | |
| 5,856,750 A | 1/1999 | Koseki | |
| 5,886,556 A | * 3/1999 | Ganger et al. | 327/199 |
| 6,118,348 A | * 9/2000 | Narahara | 331/116 FE |
| 6,181,172 B1 | * 1/2001 | Callahan | 326/112 |

FOREIGN PATENT DOCUMENTS

JP  409064700 A * 3/1997 .......... H03K/3/354

* cited by examiner

Primary Examiner—Michael G. Lee
Assistant Examiner—Steven S. Paik
(74) Attorney, Agent, or Firm—Dickstein Shapiro Morin & Oshinsky LLP

(57) ABSTRACT

An adaptive threshold logic circuit is provided in which the switching threshold levels of the logic circuit are automatically changed to accommodate variations in the level of applied data signals to the switching circuit. A detector stage detects the voltage level of the incoming data signals and selectively adjusts the threshold level of a threshold adaptor stage in accordance with the output of the detector stage. The threshold adaptor stage is essentially an adaptive CMOS inverter having various switching paths turned on or off in accordance with the output of the detector stage.

61 Claims, 4 Drawing Sheets

ADAPTIVE THRESHOLD LOGIC CIRCUIT

FIELD OF THE INVENTION

The present invention relates to a logic circuit which is capable of adjusting a switching threshold in accordance with the voltage level of applied input logic signals.

BACKGROUND OF THE INVENTION

Digital logic circuits are sometimes arranged such that a first logic circuit operates with one supply voltage, e.g., 3.3 volts, while another circuit supplying input logic signals to the first logic circuit operates with a different supply voltage, e.g., 1.8 volts. In such a case, the logic signals supplied to the first logic circuit are incompatible with the switching threshold of the first logic circuit, which is set for applied input signals of 3.3 volts, causing erroneous and undesired switching operations.

A simple way of adjusting a switching threshold of a logic circuit to handle input logic signals of different voltage levels is needed.

BRIEF SUMMARY OF THE INVENTION

The present invention provides a simple way of adjusting the switching threshold of a logic circuit in accordance with the signal level of input logic signals which are applied to it.

The invention provides a logic circuit with a voltage level detector stage which detects the supply voltage of a circuit supplying applied input signals, and an adaptive threshold stage which, in response to the output of the detector stage, selects a switching threshold level for switching operations in response to the applied logic input signals.

The adaptive threshold stage may be formed as a CMOS inverter circuit in which certain transistors are turned on or off in response to the output of the detector stage to thereby alter the inverter switching threshold.

These and other features and advantages of the invention will be more clearly seen from the following description of the invention which is provided in conjunction with the accompanying drawings.

DETAILED DESCRIPTION OF THE INVENTION

Figure 1:
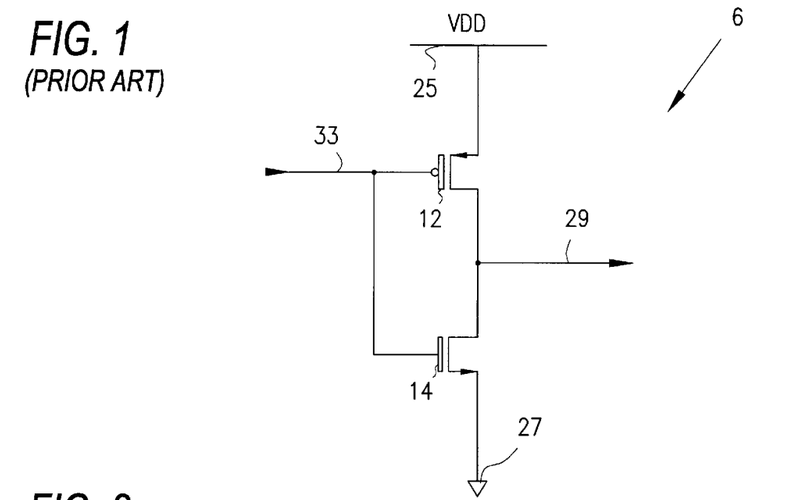
FIG. 1 depicts a conventional CMOS inverter circuit.

FIG. 1 is an electrical schematic drawing of a typical CMOS inverter 6 which switches states in response to switching states of logic signals applied to input line 33. The inverter 6 includes a p-channel MOS transistor 12 serially connected to an n-channel MOS transistor 14, with the serial connection of the two transistors being connected between $V_{DD}$ 25 and ground 27. The CMOS inverter 6 provides inverted output logic signals on line 29 in response to the states of logic signals applied to input line 33.

The transistors 12 and 14 are configured such that when $V_{DD}$ is at one voltage level, e.g., 3.3 volts, and the input logic signals on line 33 transition between voltage levels of zero and 3.3 volts, the inverted output signals on line 29 are likewise transitioning between 3.3 volts and zero volts with relatively low signal skew or waveform distortion because the switching threshold of transistors 12 and 14 is well matched to the expected zero to 3.3 volt transitions of the signals on line 33.

Figure 2:
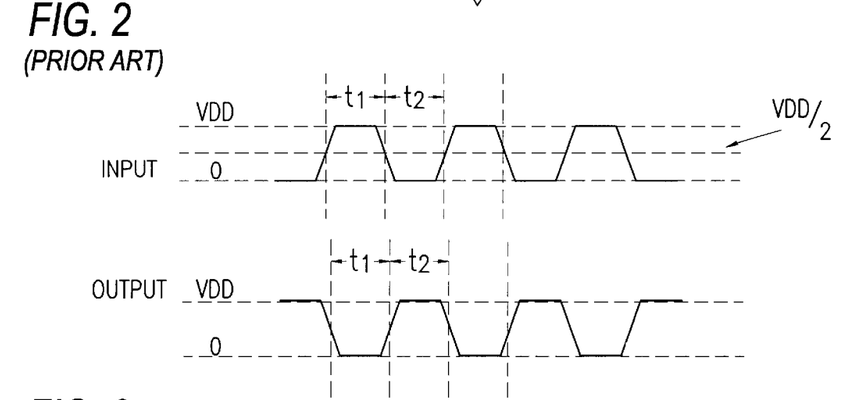
FIG. 2 and FIG. 3 are timing diagrams illustrating operation of the FIG. 1 circuit.

This is illustrated in FIG. 2 which shows that the output of inverter 6 begins to transition state in response to an input logic signal reaching a value of approximately $V_{DD}/2$ on rising and falling edges of the input-logic signal. In actuality, there may be a slight respective offset from $V_{DD}/2$ for the switching threshold on the rising and falling edges of the input signal. In other words, the switching threshold is approximately centered between zero volts and $V_{DD}$. The cycle of the output signal waveform is essentially the same as that of the input signal waveform, that is $t_1=t_2$.

Figure 3:
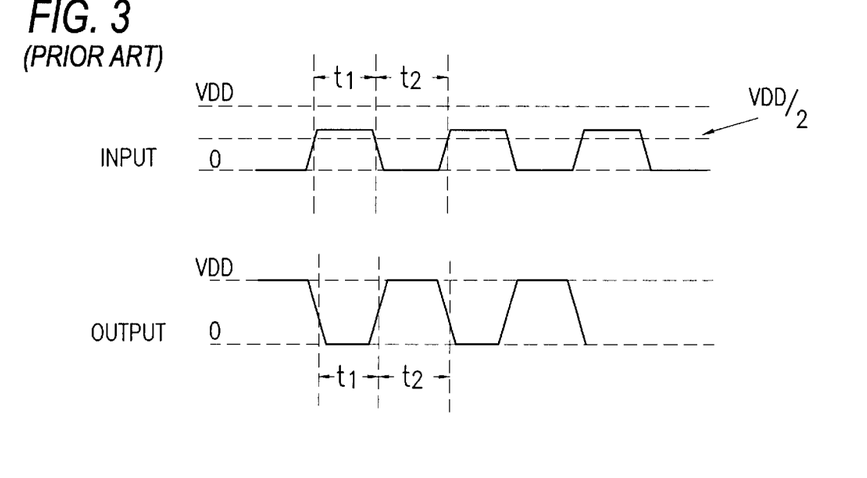

When, however, an input logic signal transitions between zero volts and a voltage level lower than $V_{DD}$, e.g., 1.8 volts, as shown in FIG. 3, the output signal waveform is distorted because the switching threshold of inverter 6 remains at essentially $V_{DD}/2$ which is not centered between zero and 1.8 volts. As a result, the duty cycle of the output signal waveform is different from the duty cycle of the applied input signal, and the output signal on line 29 is no longer a true representation of the inverted input signal on line 33, i.e., $t_1 \neq t_2$.

The present invention avoids this problem and provides an adaptive logic circuit which can change the switching threshold in response to the voltage level of the applied input signal so that the output signal faithfully transitions with minimal switching threshold signal distortions in response to signal transitions of an applied input signal.

For purposes of simplifying discussion, the adaptive logic circuit of the invention will be illustrated as an adaptive CMOS inverter circuit, but the invention can be applied to any logic circuit having switching thresholds.

Figure 4:
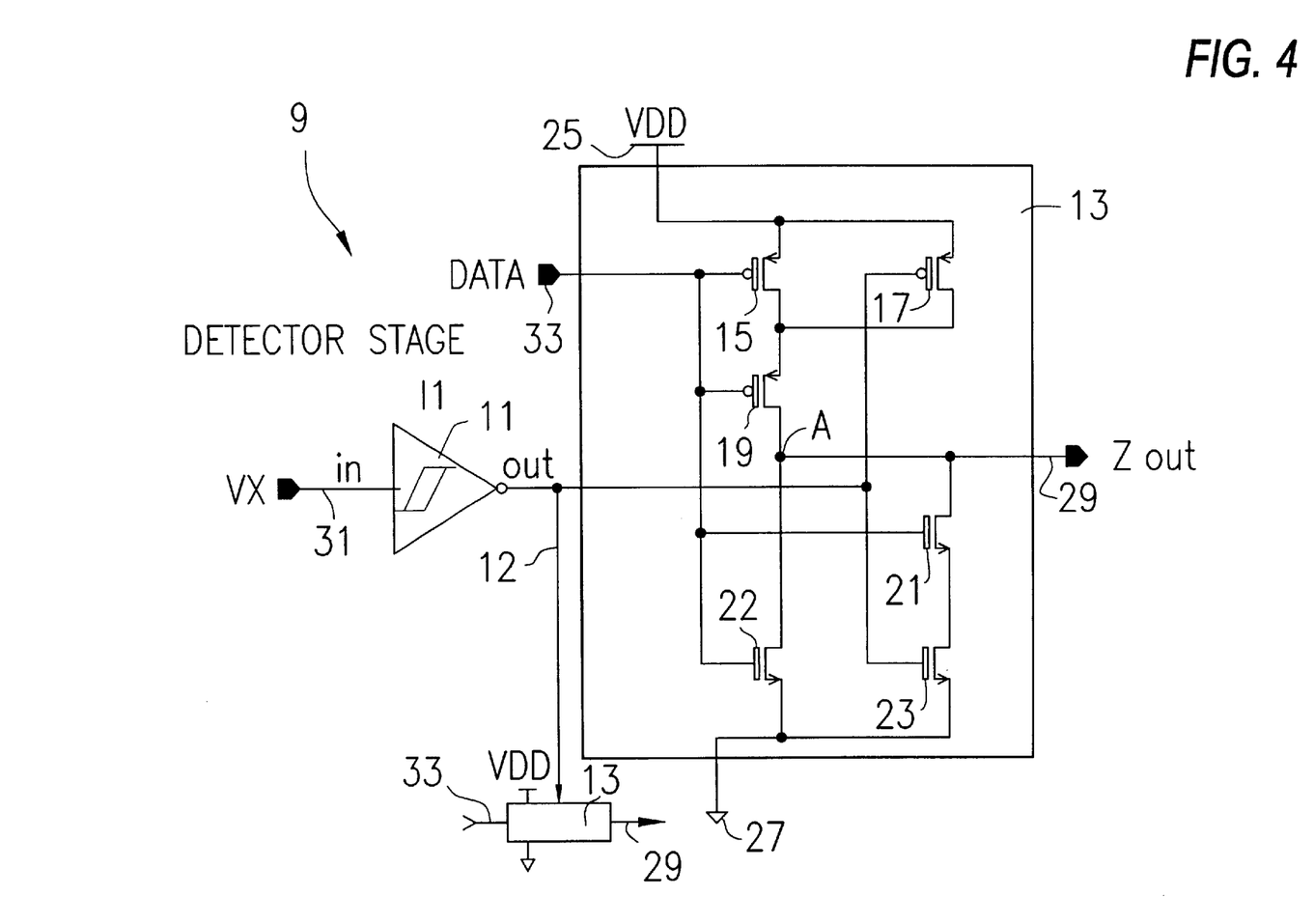
FIG. 4 depicts an adaptive threshold logic circuit in accordance with an exemplary embodiment of the invention.

Referring now to FIG. 4, an exemplary embodiment of the invention is illustrated. A CMOS inverter 9 is illustrated as including a detector stage 11 which is formed as a threshold circuit, and a threshold adapter stage 13 which is defined to accept data from a downstream logic circuit on input line 33, and provide an output signal on output line 29.

To accommodate different levels of possible input signal potential at input line 33, the invention employs detector stage 11, which may be formed as a Schmitt trigger. This is an inverter stage which has a predefined threshold which may be preset. An input to detector stage 11 is from an input line $V_x$ which receives a voltage signal which is the supply voltage of a downstream logic circuit which provides logic signals at input line 33. If $V_x$ is at a level of VDD, e.g., 3.3 volts, indicating that the downstream circuit potential is at the same level as the $V_{DD}$ of the threshold adaptor stage 13, the detector stage produces a first output signal at its output. If, on the other hand, a signal at the input terminal $V_x$ is below $V_{DD}$, by a specified percentage as set as a threshold of the detector stage 11, the detector stage produces a second output signal.

The switching threshold of the detector stage 11 can be set so that the detector stage will switch when the voltage applied to the input $V_x$ is below by a certain percentage the supply voltage $V_{DD}$ of the threshold adaptor stage 13, e.g., a voltage of 70% of $V_{DD}$.

The threshold adaptor stage 13 as shown in FIG. 4 includes p-channel MOS transistors 15, 17, 19, and n-channel MOS transistors 21, 22, and 23. Transistors 15, 19 and 22 are connected between the voltage potential $V_{DD}$ 25 and ground 27. The gates of p-channel transistors 15 and 19 are coupled together and are further coupled to the input line 33. The gate of n-channel transistor 22 is also coupled to the input line 33.

P-channel transistor 17 is connected in parallel with the p-channel transistor 15, and the gate of transistor 17 is connected to the output of the detector stage 11. The connection between the serially connected transistors 19 and 22 forms a node A which is in turn connected to the output line 29. Connected between the output line 29 and ground 27 is a pair of serially connected n-channel transistors 21 and 23. N-channel transistor 22 is connected between node A and ground, and is also connected in parallel with the series connection of transistors 21 and 23.

The gate of transistor 23 is also connected to the output of detector stage 11, and the gate of transistor 21 is connected to the line input 33. Thus, adaptor stage 13 is a CMOS inverter formed by p-channel transistors 15, 17 and 19 and n-channel transistors 21, 22 and 23. However, the switching threshold of threshold adaptor stage 13 can change depending on the on or off condition of transistors 17 and 23 which are controlled by the output of the detector stage 11.

The detector stage 11 output is either a low logic level if the signal applied to the $V_x$ input terminal 31 exceeds the threshold of detector stage 11, that is, is close to a voltage $V_{DD}$ of the threshold adaptor stage 13, or is at a logic high level if the signal applied to the $V_x$ input terminal 31 is below the detector stage 11 threshold.

When the output of the detector stage 11 is in a low state, transistor 23 is turned off and transistor 17 is turned on. Since transistor 23 is turned off, transistor 21 is rendered nonconductive. Transistor 15 is, in turn, bypassed by virtue of transistor 17 being on. As a result, the switching threshold for input signals on line 33 is set by the switching characteristics of transistors 19 and 22.

On the other hand, if the output of the detector stage 11 is high, meaning that the voltage at $V_x$ is below the preset threshold then transistor 23 is turned on and transistor 17 is turned off. In this state, the switching level of adaptor stage 13 is set by the switching state established by the series connection of transistors 15 and 19 which is in series with the parallel circuit formed by transistor 22 in parallel with the series connection of transistors 21 and 23.

Transistors 17 and 21 are much larger transistors than the other transistors so that they are effectively on or off switches, so threshold adjustments in each of the two different switching threshold states can be made by selecting the switching characteristics of the remaining transistors 15, 19, 22 and 23.

Thus, depending on the voltage detected by detector stage 11, the threshold of the threshold adaptor stage 13 can be adjusted by switching one of transistors 17 and 23 on and the other off in accordance with the output of detector stage 11 to thereby change the CMOS inverter 9 from a first threshold switching characteristic to a second threshold switching characteristic. Since the voltage on input line 31 represents the level of the logic signals applied to input line 33, an appropriate switching threshold can be set by the threshold adaptor stage 13 so that the output signal at output terminal 29 is appropriate for the logic input signals applied at input line 33.

Figure 5:
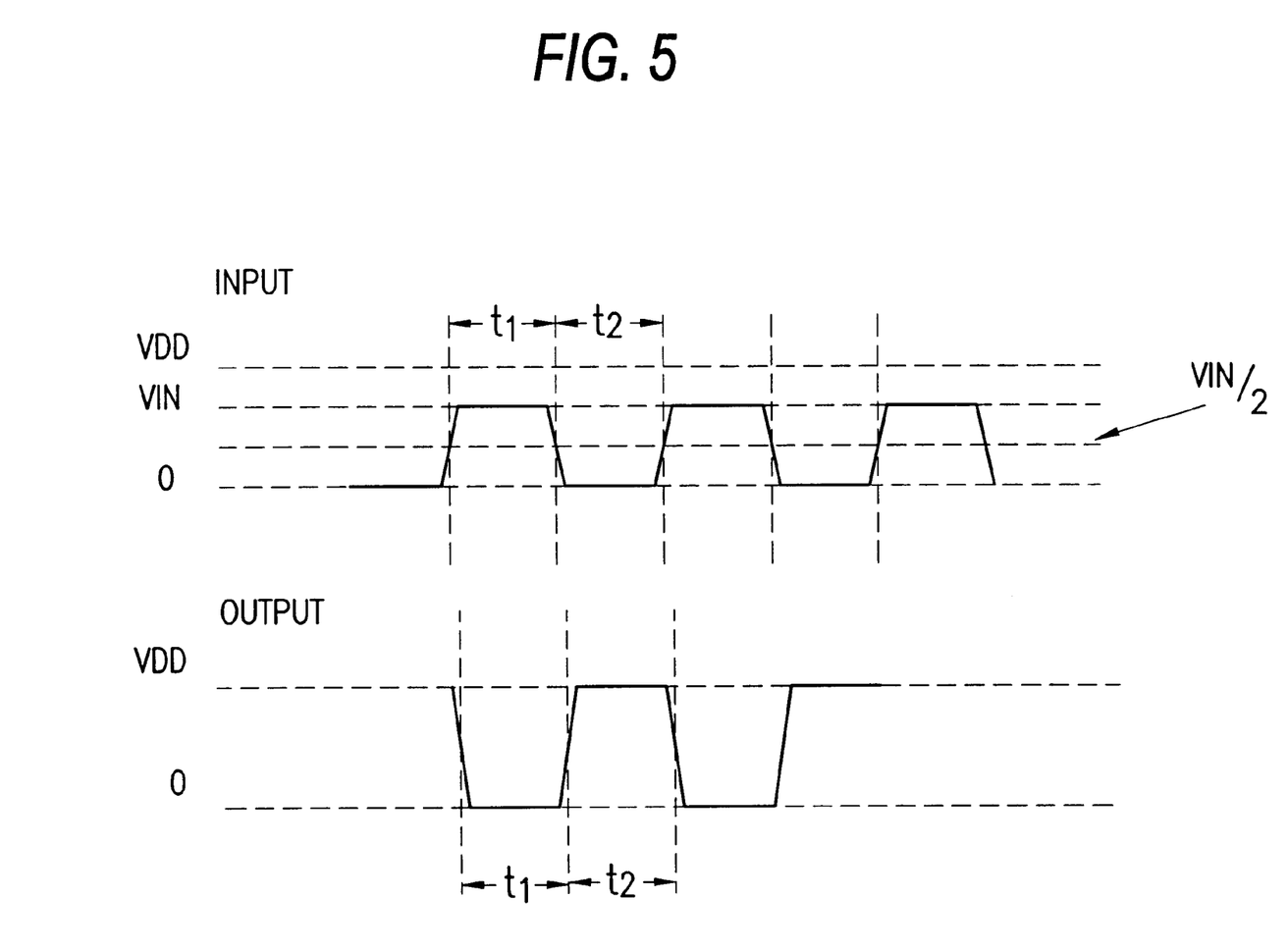
FIG. 5 is a timing diagram illustrating operation of the FIG. 4 circuit.

FIG. 5 illustrates how the threshold voltage of CMOS inverter 6 changes between a first threshold value of $V_{DD}/2$ associated with input logic signals which transition between zero volts and $V_{DD}$, and a second threshold value of $V_{in}/2$ associated with input logic signals which transition between zero volts and $V_{in}$. Transistors 15, 19, 22 and 23 are fabricated to provide these two switching thresholds depending on the on/off states of transistor 17 and 21.

FIG. 4 also shows that one detector stage 11 can control the switching threshold of a plurality of threshold adaptor stages 13.

Figure 6:
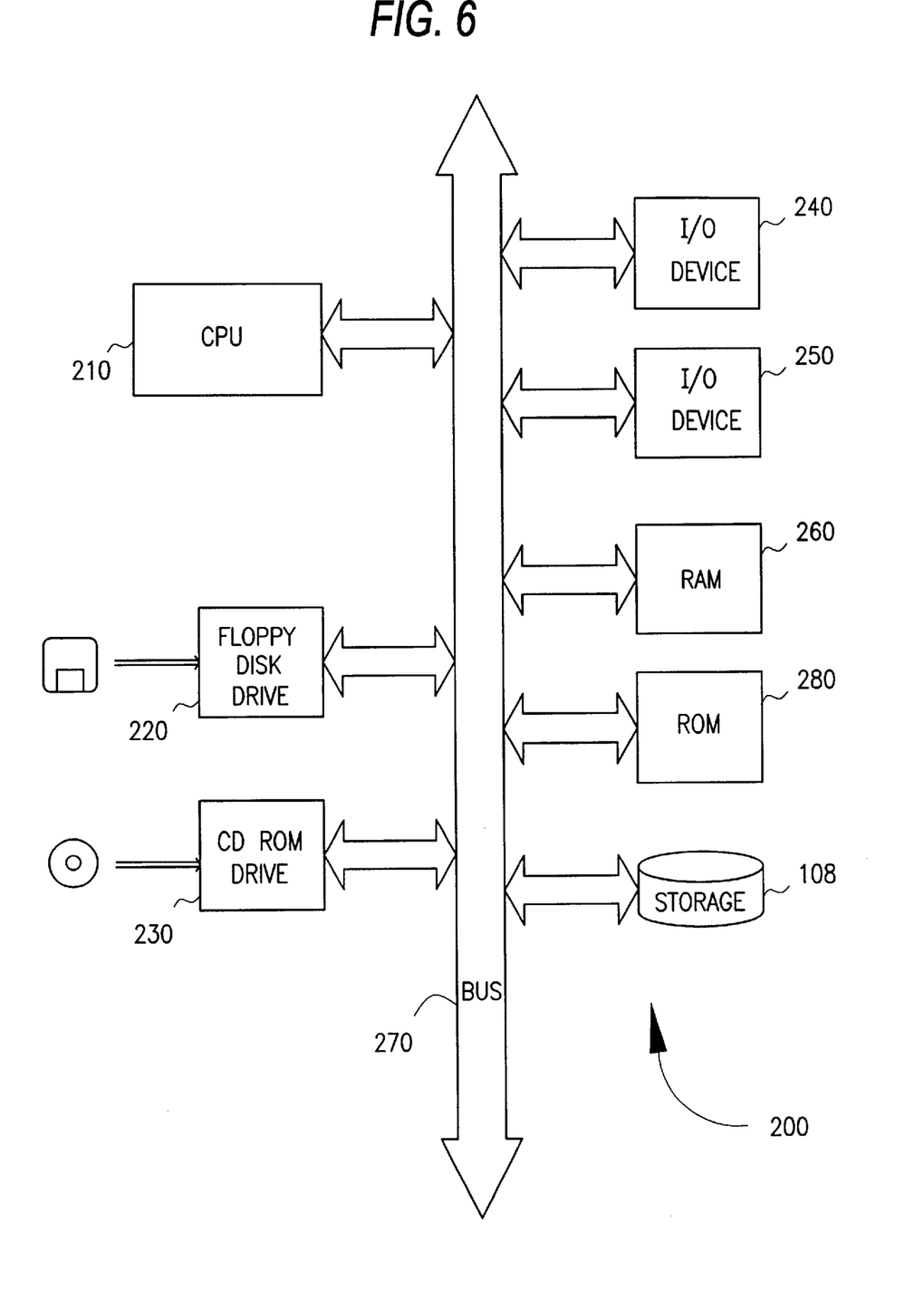
FIG. 6 depicts a processor system containing various components which may employ an adaptive threshold logic circuit of the invention.

The invention may be used in any digital logic circuit, including but not limited to gate circuits, inverters, timing circuits and in larger devices such as a DSP, programmable logic devices, processors, memory devices which include memory cell arrays and peripheral logic coupled to the array, and the like. For example, as shown in FIG. 6, a processor based system, such as a computer system, for example, generally comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and, in the case of a computer system may include peripheral devices such as a floppy disk drive 220 and a compact disk (CD) ROM drive 230 which also communicate with CPU 210 over the bus 270. At least one of CPU 210 and one or more integrated circuits connected thereto, such as employed for RAM 260 and ROM 280, are preferably constructed as integrated circuits which include an adaptive threshold logic circuit as described above with respect to FIGS. 4 and 5. It may also be desirable to integrate the processor 210 and memory 260 on a single IC chip and have one or both of processor 210 and memory 260 employ the adaptive threshold logic circuit described above with reference to FIGS. 4 and 5.

While an exemplary embodiment of the invention has been described and illustrated above, it should be apparent that many modification substitutions and other variations can be made without departing from the spirit or scope of the invention. Accordingly, the invention is not to be considered as limited by the foregoing description and accompany drawings, and is only limited by the scope of the appended claims.

What is claimed as new and desired to be protected by Letters Patent of the United States is:

1. An adaptive logic circuit comprising:
   an input terminal for receiving logic input signals;
   an output terminal;
   a switching circuit responsive to received logic input signals at said input to supply logic output signals to said output terminal, said switching circuit having at least two selectable switching threshold characteristics; and
   a detector circuit having a further input terminal for detecting a voltage level at said further input terminal representative of the supply voltage level of a received logic input signal;
   said switching circuit selecting a switching threshold characteristic in accordance with an output of said detector circuit.

2. A logic circuit as in claim 1 wherein said switching circuit forms a CMOS inverter circuit which inverts the logic level of said received logic signals and supplies the inverted logic level at said output terminal.

3. A logic circuit as in claim 2 wherein said CMOS inverter circuit includes a first circuit comprising transistors of a first conductivity type connected between a first voltage potential and said output terminal and a second circuit comprising transistors of a second conductivity type connected between said output terminal and a second voltage potential, said switching circuit selecting preselected ones of the transistors of said first and second circuits for operation in response to the output of said detector circuit.

4. A logic circuit as in claim 3 wherein said second circuit comprises a first and second transistor connected in series, the series connection of said first and second transistors being connected in parallel with a third transistor, the gates of one of said first and second transistors and said third transistor being connected to said input terminal and the gate of the other of said first and second transistors being connected to the output of said detector.

5. A logic circuit as in claim 4 wherein said first, second and third transistors are n-channel transistors.

6. A logic circuit as in claim 1 wherein said detector circuit is a Schmitt circuit.

7. A logic circuit as in claim 3 wherein said first circuit comprises first and second transistors connected in parallel, the parallel connection of said first and second transistors being connected in series with a third transistor, the gates of one of said first and second transistors and said third transistor being connected to said input terminal and the gate of the other of said first and second transistors being connected to the output of said detector.

8. A logic circuit as in claim 7 wherein said first, second and third transistors are p-channel transistors.

9. An adaptive logic circuit comprising:
a first input terminal for receiving an applied logic signal;
a second input terminal for receiving a signal representing a supply voltage of said applied logic signal received at said first input terminal;
a threshold detector circuit connected to said second input terminal;
an output terminal; and
an adaptive CMOS inverter connected between said input and output terminals, said adaptive CMOS inverter having a switching threshold which is changeable in accordance with an output of said detector circuit.

10. A logic circuit as in claim 9 wherein said CMOS inverter comprises first, second and third transistors of a first conductive type and fourth, fifth and six transistors of a second conductive type,
said first and second transistors being connected in parallel and the parallel connection of said first and second transistors being connected in a first series with said third transistor, said first series connection being connected between a first voltage supply terminal and said output terminal, the gates of one of said first and second transistors and said third transistor being connected to said input terminal, the gate of the other of said first and second transistors being connected to an output of said detector circuit, said fourth and fifth transistors being connected in a second series and the second series being connected in parallel with said sixth transistor, said second series connection being connected between said output terminal and a second voltage supply terminal, the gates of one of said fourth and fifth transistors and said sixth transistor being connected to said input terminal, the gate of the other of said fourth and fifth transistors being connected to the output of said detector circuit.

11. A logic circuit as in claim 10 wherein said first, second and third transistors are p-channel transistors and said fourth, fifth and sixth transistors are n-channel transistors.

12. A logic circuit as in claim 9 further comprising a plurality of adaptive CMOS inverters connected between respective input terminals for receiving applied logic signals and respective output terminals, each of said adaptive CMOS inverters having a switching threshold which is changeable in accordance with the output of said detector circuit.

13. A memory device comprising:
a memory cell array; and
a logic circuit coupled to said array and comprising:
an input terminal for receiving a logic input signal;
an output terminal;
a switching circuit responsive to said received logic input signal at said input terminal to supply a logic output signal to said output terminal, said switching circuit having at least two selectable switching threshold characteristics; and
a detector circuit having a further input for detecting a supply voltage level representative of one of two stable voltage levels of said received logic input signal;
said switching circuit selecting a switching threshold characteristic in accordance with the output of said detector circuit.

14. A memory device as in claim 13 wherein said switching circuit forms a CMOS inverter circuit which inverts the logic level of said received logic signals and supplies the inverted logic level at said output terminal.

15. A memory device as in claim 14 wherein said CMOS inverter circuit includes a first circuit comprising transistors of a first conductivity type connected between a first voltage potential and said output terminal and a second circuit comprising transistors of a second conductivity type connected between said output terminal and a second voltage potential, said switching circuit selecting preselected ones of the transistors of said first and second circuits for operation in response to the output of said detector circuit.

16. A memory device as in claim 15 wherein said first circuit comprises first and second transistors connected in parallel, the parallel connection of said first and second transistors being connected in series with a third transistor, the gates of one of said first and second transistors and said third transistor being connected to said input terminal and the gate of the other of said first and second transistors being connected to the output of said detector.

17. A memory device as in claim 15 wherein said first, second and third transistors are p-channel transistors.

18. A memory device as in claim 15 wherein said second circuit comprises a first and second transistor connected in series, the series connection of said first and second transistors being connected in parallel with a third transistor, the gates of one of said first and second transistors and said third transistor being connected to said input terminal and the gate of the other of said first and second transistors being connected to the output of said detector.

19. A memory device as in claim 18 wherein said first, second and third transistors are n-channel transistors.

20. A memory device as in claim 13 wherein said detector circuit is a Schmit circuit.

21. A memory device as in claim 13 further comprising a plurality of switching circuits connected between respective input and output terminals and responsive to received logic input signals at said input terminals to supply logic output signals at respective output terminals, each of said switching circuits having at least two selectable switching threshold characteristics, each of said switching circuits selecting a switching threshold characteristic in accordance with an output of said detector circuit.

22. A memory device as in claim 13 wherein said memory device is provided on a memory module.

23. A memory device comprising:

a memory cell array;

a logic circuit coupled to said array and comprising:

a first input terminal for receiving an applied logic signal;

a second input terminal for receiving a signal representing a supply voltage of said logic signal received at said first input terminal;

a threshold detector circuit connected to said second input terminal;

an output terminal; and an adaptive CMOS inverter connected between said first input terminal and said output terminal, said adaptive CMOS inverter having a switching threshold which is changeable in accordance with said signal representing said supply voltage.

24. A memory device as in claim 23 wherein said CMOS inverter comprises first, second and third transistors of a first conductive type and fourth, fifth and six transistors of a second conductive type, said first and second transistors being connected in parallel and the parallel connection of said first and second transistors being connected in a first series with said third transistor, said first series connection being connected between a first voltage supply terminal and said output terminal, the gates of one of said first and second transistors and said third transistor being connected to said input terminal, the gate of the other of said first and second transistors being connected to an output of said detector circuit, said fourth and fifth transistors being connected in a second series and the second series being connected in parallel with said sixth transistor, said second series connection being connected between said output terminal and a second voltage supply terminal, the gates of one of said fourth and fifth transistors and said sixth transistor being connected to said input terminal, the gate of the other of said fourth and fifth transistors being connected to the output of said detector circuit.

25. A memory device as in claim 24 wherein said first, second and third transistors are p-channel transistors and said fourth, fifth and sixth transistors are n-channel transistors.

26. A memory device as in claim 23 wherein said memory device is provided on a memory module.

27. A processor system comprising:

a processor; and at least one memory device coupled to said processor, at least one of said processor and memory device comprising:

an input terminal for receiving logic input signals;

an output terminal;

a switching circuit responsive to received logic input signals at said input to supply logic output signals to said output terminal, said switching circuit having at least two selectable switching threshold characteristics; and a detector circuit for detecting a voltage level representative of a respective supply voltage level of one of said received logic input signals;

said switching circuit selecting a switching threshold characteristic in accordance with an output of said detector circuit.

28. A system as in claim 27 wherein said switching circuit forms a CMOS inverter circuit which inverts the logic level of said received logic signals and supplies the inverted logic level at said output terminal.

29. A system as in claim 28 wherein said CMOS inverter circuit includes a first circuit comprising transistors of a first conductivity type connected between a first voltage potential and said output terminal and a second circuit comprising transistors of a second conductivity type connected between said output terminal and a second voltage potential, said switching circuit selecting preselected ones of the transistors of said first and second circuits for operation in response to the output of said detector circuit.

30. A system as in claim 29 wherein said first circuit comprises first and second transistors connected in parallel, the parallel connection of said first and second transistors being connected in series with a third transistor, the gates of one of said first and second transistors and said third transistor being connected to said input terminal and the gate of the other of said first and second transistors being connected to the output of said detector.

31. A system as in claim 30 wherein said first, second and third transistors are p-channel transistors.

32. A system as in claim 29 wherein said second circuit comprises a first and second transistor connected in series, the series connection of said first and second transistors being connected in parallel with a third transistor, the gates of one of said first and second transistors and said third transistor being connected to said input terminal and the gate of the other of said first and second transistors being connected to the output of said detector.

33. A system as in claim 32 wherein said first, second and third transistors are n-channel transistors.

34. A system as in claim 27 wherein said detector circuit is a Schmitt circuit.

35. A processor system comprising:

a processor; and at least one memory device coupled to said processor;

at least one of said processor and memory device comprising:

a first input terminal for receiving applied logic signals;

a second input terminal for receiving a signal representing a peak voltage of said logic signal received at said first input terminal;

a threshold detector circuit connected to said second input terminal;

an output terminal; and an adaptive CMOS inverter connected between said input and output terminals, said adaptive CMOS inverter having a switching threshold which is changeable in accordance with the output of said detector circuit.

36. A system as in claim 35 wherein said CMOS inverter comprises first, second and third transistors of a first conductive type and fourth, fifth and sixth transistors of a second conductive type, said first and second transistors being connected in parallel and the parallel connection of said first and second transistors being connected in a first series with said third transistor, said first series connection being connected between a first voltage supply terminal and said output terminal, the gates of one of said first and second transistors and said third transistor being connected to said input terminal, the gate of the other of said first and second transistors being connected to an output of said detector circuit, said fourth and fifth transistors being connected in a second series and the second series being connected in parallel with said sixth transistor, said second series connection being connected between said output terminal and a second voltage supply terminal, the gates of one of said fourth and fifth transistors and said sixth transistor being connected to said input terminal, the gate of the other of said fourth and fifth transistors being connected to the output of said detector circuit.

37. A system as in claim 36 wherein said first, second and third transistors are p-channel transistors and said fourth, fifth and sixth transistors are n-channel transistors.

38. A method of operating an inverter circuit comprising:
receiving logic input signals;
operating said inverter to provide an output signal based on an inversion of said received logic input signals; and
changing the switching characteristics of said inverter if an operating voltage level of a circuit which supplies said input signals is below an operating voltage level of said inverter by a predetermined amount.

39. A method as in claim 38 further comprising controlling predetermined transistors of said inverter to set a threshold switching level for said inverter in accordance with the operating voltage level of said circuit which supplies said input signals.

40. A method as in claim 39 wherein said inverter is a CMOS inverter which has a first plurality of p-channel transistors and a second plurality of n-channel transistors, at least one of said p-channel transistors and at least one of said n-channel transistors being controlled to set said threshold level.

41. An adaptive logic circuit comprising:
an input terminal for receiving logic input signals;
an output terminal;
a switching circuit responsive to received logic input signals at said input to supply logic output signals to said output terminal, said switching circuit having at least two selectable switching threshold characteristics; and
a detector circuit for detecting a voltage level representative of the voltage level of received logic input signals;
said switching circuit selecting a switching threshold characteristic in accordance with the output of said detector circuit, wherein said switching circuit forms a CMOS inverter circuit which inverts the logic level of said received logic signals and supplies the inverted logic level at said output terminal, and wherein said CMOS inverter circuit includes a first circuit comprising transistors of a first conductivity type connected between a first voltage potential and said output terminal and a second circuit comprising transistors of a second conductivity type connected between said output terminal and a second voltage potential, said switching circuit selecting preselected ones of the transistors of said first and second circuits for operation in response to the output of said detector circuit.

42. The adaptive logic circuit as in claim 41 wherein said first circuit comprises first and second transistors connected in parallel, the parallel connection of said first and second transistors being connected in series with a third transistor, the gates of one of said first and second transistors and said third transistor being connected to said input terminal and the gate of the other of said first and second transistors being connected to the output of said detector.

43. The adaptive logic circuit as in claim 42 wherein said first, second and third transistors are p-channel transistors.

44. The adaptive logic circuit as in claim 41 wherein said second circuit comprises a first and second transistor connected in series, the series connection of said first and second transistors being connected in parallel with a third transistor, the gates of one of said first and second transistors and said third transistor being connected to said input terminal and the gate of the other of said first and second transistors being connected to the output of said detector.

45. The adaptive logic circuit as in claim 44 wherein said first, second and third transistors are n-channel transistors.

46. An adaptive logic circuit comprising:
a first input terminal for receiving applied logic signals;
a second input terminal for receiving a signal representing a voltage of logic signal received at said first input terminal;
a threshold detector circuit connected to said second input terminal;
an output terminal; and
an adaptive CMOS inverter connected between said input and output terminals, said adaptive CMOS inverter having a switching threshold which is changeable in accordance with the output of said detector circuit, wherein said CMOS inverter comprises first, second and third transistors of a first conductive type and fourth, fifth and six transistors of a second conductive type, said first and second transistors being connected in parallel and the parallel connection of said first and second transistors being connected in a first series with said third transistor, said first series connection being connected between a first voltage supply terminal and said output terminal, the gates of one of said first and second transistors and said third transistor being connected to said input terminal, the gate of the other of said first and second transistors being connected to an output of said detector circuit, said fourth and fifth transistors being connected in a second series and the second series being connected in parallel with said sixth transistor, said second series connection being connected between said output terminal and a second voltage supply terminal, the gates of one of said fourth and fifth transistors and said sixth transistor being connected to said input terminal, the gate of the other of said fourth and fifth transistors being connected to the output of said detector circuit.

47. The adaptive logic circuit as in claim 46 wherein said first, second and third transistors are p-channel transistors and said fourth, fifth and sixth transistors are n-channel transistors.

48. A memory device comprising:
a memory cell array; and
a logic circuit coupled to said array and comprising:
an input terminal for receiving logic input signals;
an output terminal;
a switching circuit responsive to received logic input signals at said input terminal to supply logic output signals to said output terminal, said switching circuit having at least two selectable switching threshold characteristics; and
a detector circuit for detecting a voltage level representative of the voltage level of received logic input signals;
said switching circuit selecting a switching threshold characteristic in accordance with the output of said detector circuit, wherein said switching circuit forms a CMOS inverter circuit which inverts the logic level of said received logic signals and supplies the inverted logic level at said output terminal, and wherein said CMOS inverter circuit includes a first circuit comprising transistors of a first conductivity type connected between a first voltage potential and said output terminal and a second circuit comprising transistors of a second conductivity type connected between said output terminal and a second voltage potential, said switching circuit selecting preselected ones of the transistors of said first and second circuits for operation in response to the output of said detector circuit.

49. The memory device as in claim 48 wherein said first circuit comprises first and second transistors connected in parallel, the parallel connection of said first and second transistors being connected in series with a third transistor, the gates of one of said first and second transistors and said third transistor being connected to said input terminal and the gate of the other of said first and second transistors being connected to the output of said detector.

50. The memory device as in claim 48 wherein said first, second and third transistors are p-channel transistors.

51. The memory device as in claim 48 wherein said second circuit comprises a first and second transistor connected in series, the series connection of said first and second transistors being connected in parallel with a third transistor, the gates of one of said first and second transistors and said third transistor being connected to said input terminal and the gate of the other of said first and second transistors being connected to the output of said detector.

52. The memory device as in claim 51 wherein said first, second and third transistors are n-channel transistors.

53. A memory device comprising:
   a memory cell array;
   a logic circuit coupled to said array and comprising:
   a first input terminal for receiving applied logic signals;
   a second input terminal for receiving a signal representing a voltage of logic signal received at said first input terminal;
   a threshold detector circuit connected to said second input terminal;
   an output terminal; and
   an adaptive CMOS inverter connected between said input and output terminals, said adaptive CMOS inverter having a switching threshold which is changeable in accordance with the output of said detector circuit, wherein said CMOS inverter comprises first, second and third transistors of a first conductive type and fourth, fifth and six transistors of a second conductive type,
   said first and second transistors being connected in parallel and the parallel connection of said first and second transistors being connected in a first series with said third transistor, said first series connection being connected between a first voltage supply terminal and said output terminal, the gates of one of said first and second transistors and said third transistor being connected to said input terminal, the gate of the other of said first and second transistors being connected to an output of said detector circuit, said fourth and fifth transistors being connected in a second series and the second series being connected in parallel with said sixth transistor, said second series connection being connected between said output terminal and a second voltage supply terminal, the gates of one of said fourth and fifth transistors and said sixth transistor being connected to said input terminal, the gate of the other of said fourth and fifth transistors being connected to the output of said detector circuit.

54. The memory device as in claim 53 wherein said first, second and third transistors are p-channel transistors and said fourth, fifth and sixth transistors are n-channel transistors.

55. A processor system comprising:
   a processor; and
   at least one memory device coupled to said processor, at least one of said processor and memory device comprising:
   an input terminal for receiving logic input signals;
   an output terminal;
   a switching circuit responsive to received logic input signals at said input to supply logic output signals to said output terminal, said switching circuit having at least two selectable switching threshold characteristics; and
   a detector circuit for detecting a voltage level representative of the voltage level of received logic input signals;
   said switching circuit selecting a switching threshold characteristic in accordance with the output of said detector circuit, wherein said switching circuit forms a CMOS inverter circuit which inverts the logic level of said received logic signals and supplies the inverted logic level at said output terminal, wherein said CMOS inverter circuit includes a first circuit comprising transistors of a first conductivity type connected between a first voltage potential and said output terminal and a second circuit comprising transistors of a second conductivity type connected between said output terminal and a second voltage potential, said switching circuit selecting preselected ones of the transistors of said first and second circuits for operation in response to the output of said detector circuit.

56. The processor system as in claim 55 wherein said first circuit comprises first and second transistors connected in parallel, the parallel connection of said first and second transistors being connected in series with a third transistor, the gates of one of said first and second transistors and said third transistor being connected to said input terminal and the gate of the other of said first and second transistors being connected to the output of said detector.

57. The processor system as in claim 56 wherein said first, second and third transistors are p-channel transistors.

58. The processor system as in claim 55 wherein said second circuit comprises a first and second transistor connected in series, the series connection of said first and second transistors being connected in parallel with a third transistor, the gates of one of said first and second transistors and said third transistor being connected to said input terminal and the gate of the other of said first and second transistors being connected to the output of said detector.

59. The processor system as in claim 58 wherein said first, second and third transistors are n-channel transistors.

60. A processor system comprising:
   a processor; and
   at least one memory device coupled to said processor;
   at least one of said processor and memory device comprising:
   a first input terminal for receiving applied logic signals;
   a second input terminal for receiving a signal representing a voltage of logic signal received at said first input terminal;
   a threshold detector circuit connected to said second input terminal;

an output terminal; and an adaptive CMOS inverter connected between said input and output terminals, said adaptive CMOS inverter having a switching threshold which is changeable in accordance with the output of said detector circuit, wherein said CMOS inverter comprises first, second and third transistors of a first conductive type and fourth, fifth and six transistors of a second conductive type, said first and second transistors being connected in parallel and the parallel connection of said first and second transistors being connected in a first series with said third transistor, said first series connection being connected between a first voltage supply terminal and said output terminal, the gates of one of said first and second transistors and said third transistor being connected to said input terminal, the gate of the other of said first and second transistors being connected to an output of said detector circuit, said fourth and fifth transistors being connected in a second series and the second series being connected in parallel with said sixth transistor, said second series connection being connected between said output terminal and a second voltage supply terminal, the gates of one of said fourth and fifth transistors and said sixth transistor being connected to said input terminal, the gate of the other of said fourth and fifth transistors being connected to the output of said detector circuit.

61. The processor system as in claim 60 wherein said first, second and third transistors are p-channel transistors and said fourth, fifth and sixth transistors are n-channel transistors.

* * * * *